United States Patent [19]
Chi et al.

[11] Patent Number: 6,094,074
[45] Date of Patent: Jul. 25, 2000

[54] HIGH SPEED COMMON MODE LOGIC CIRCUIT

[75] Inventors: Kuang-Kai Chi, San Jose; Ping Xu, Milpitas, both of Calif.

[73] Assignee: Seiko Epson Corporation, Tokyo, Japan

[21] Appl. No.: 09/116,645

[22] Filed: Jul. 16, 1998

[51] Int. Cl.[7] .............................................. H03K 19/094
[52] U.S. Cl. ........................... 326/115; 326/119; 326/54; 327/307; 327/208
[58] Field of Search .............................. 326/54, 55, 115, 326/112, 119, 121; 327/307, 208

[56] References Cited

U.S. PATENT DOCUMENTS

| | | |
|---|---|---|
| 4,947,140 | 8/1990 | Tateishi . |
| 5,061,907 | 10/1991 | Rasmussen . |
| 5,149,992 | 9/1992 | Allstot et al. ............................ 326/115 |
| 5,216,390 | 6/1993 | Erftemeijer et al. . |
| 5,239,274 | 8/1993 | Chi . |
| 5,469,120 | 11/1995 | Nguyen et al. . |
| 5,583,456 | 12/1996 | Kimura .................................... 326/115 |
| 5,635,880 | 6/1997 | Brown . |
| 5,644,270 | 7/1997 | Moyer et al. . |
| 5,673,008 | 9/1997 | Sumita . |
| 5,703,543 | 12/1997 | Taylor . |
| 5,767,699 | 6/1998 | Bosnyak et al. ......................... 326/115 |
| 5,808,513 | 9/1998 | Archer ..................................... 330/253 |
| 5,909,127 | 6/1999 | Pearson et al. .......................... 326/115 |

*Primary Examiner*—Jon Santamauro
*Assistant Examiner*—Don Phu Le
*Attorney, Agent, or Firm*—John C. Chen

[57] ABSTRACT

A common mode logic (CML) circuit having an improved bias circuit and an active MOS load operating exclusively in the triode region to provide improved performance characteristics including a high speed of operation. The bias circuit of the CML circuit comprises a pair of MOS transistors, one of which has an aspect ratio ($W_P/L_P$) and the other of which has an aspect ratio ($W_P/L_P$)/n, wherein $1<n<4$. This configuration causes a third MOS transistor in the bias circuit to operate exclusively in the triode region. The CML circuit also includes a logic portion, which may be a logic gate or flip-flop, having a plurality of pairs of input MOS transistors for receiving differential input signals. In accordance with the invention, the logic portion has load MOS transistors which operate exclusively in the triode region.

11 Claims, 2 Drawing Sheets

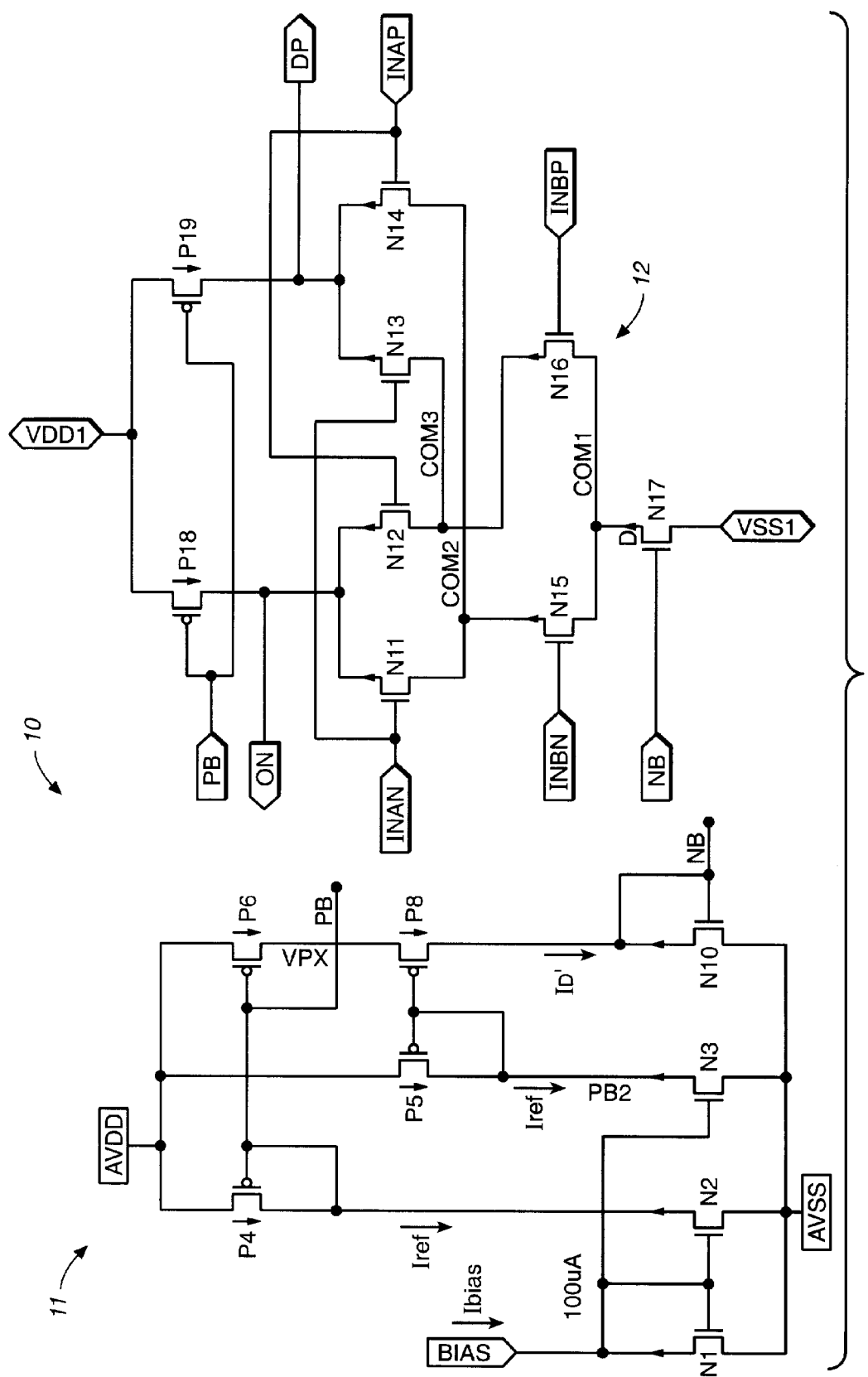
FIG._1

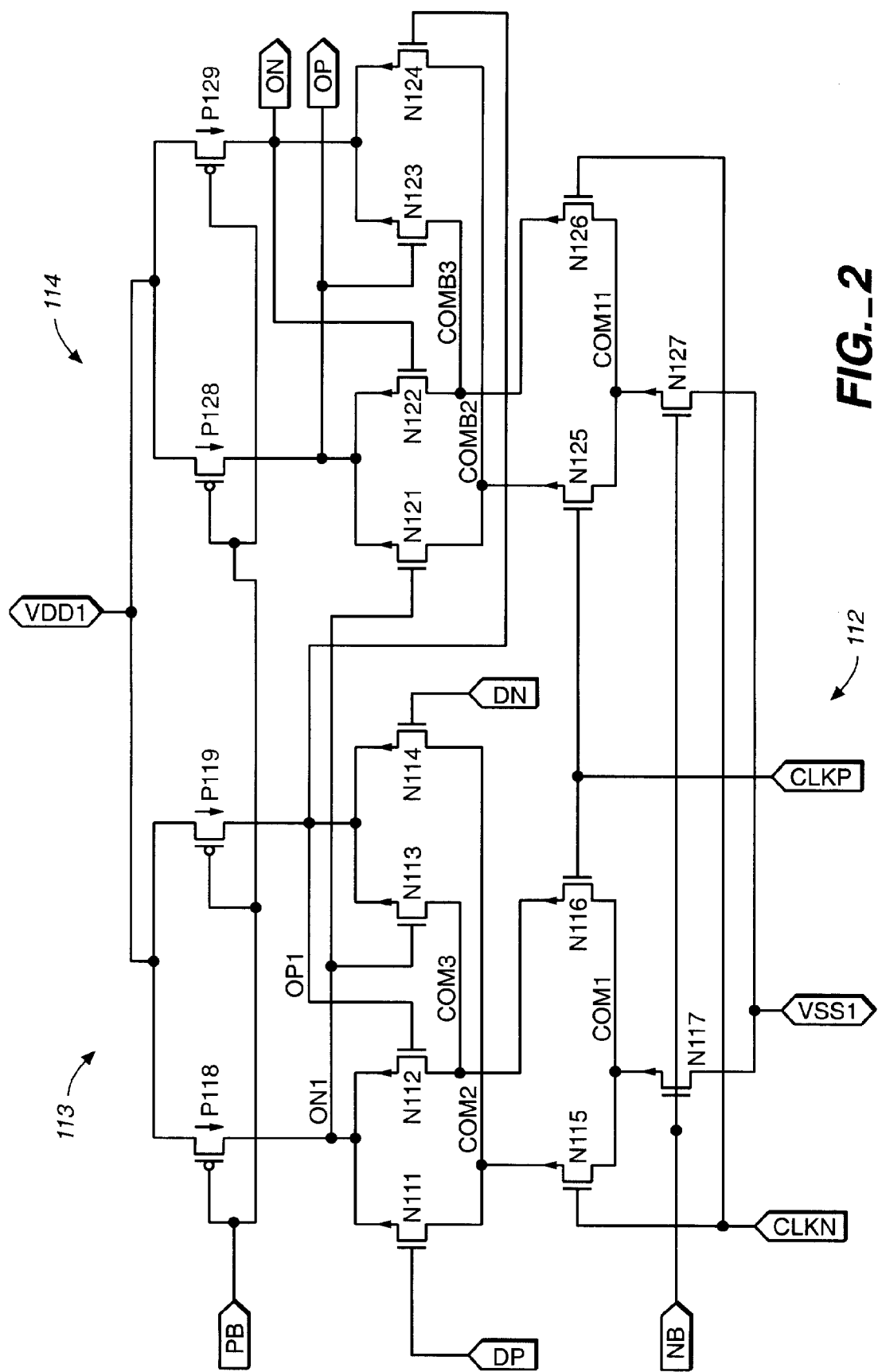
FIG._2

HIGH SPEED COMMON MODE LOGIC CIRCUIT

BACKGROUND OF THE INVENTION

1. Field of the Invention

This invention pertains to a high speed common mode logic (CML) circuit, and more particularly to a CML circuit having an active MOS load operating exclusively in the triode region to provide improved performance characteristics.

2. Description of the Related Art

The basic building block of a digital integrated circuit is a logic circuit or logic gate such as an inverter, AND gate, OR gate, NAND gate, NOR gate, XOR gate, etc. With the advent of the integrated circuit (IC), the discrete components (diodes, transistors, and resistors) which make up logic gates are fabricated on a small semiconductor crystal, sometimes called a chip. The various gates are interconnected inside the chip to form the required circuit. Digital ICs are often categorized according to their circuit complexity as determined by the number of logic gates on a single chip. Depending on the number of internal gates, which may range from only a few up to thousands, each chip is customarily referred to as being either a small-, medium-, large-, or very large-scale integration device.

Digital ICs are classified not only by their logical operation and complexity, but also by the specific circuit technology which they employ. The circuit technology is referred to as a logic family, and each family has a set of basic circuits upon which more complex digital circuits and components are developed. The basic circuits may include, for example a NAND gate, a NOR gate, an inverter, etc. Many different logic families of digital integrated circuits are commercially available. Some of the more important logic families include TTL (transistor—transistor logic), ECL (emitter-coupled logic), MOS (metal-oxide semiconductor), and CMOS (complementary metal-oxide semiconductor). Although each of these logic families has its own advantages and disadvantages, and the choice of which logic family to use in a particular application depends on various factors such as speed, cost, noise immunity, power consumption, etc., CMOS has emerged as the most popular and versatile logic family.

CMOS digital integrated circuits are useful in many different kinds of applications and are fabricated at all levels of integration, from SSI to VLSI. CMOS integrated circuits can operate at high speeds with relatively low power consumption and are more tolerant of power supply fluctuations than devices made from circuits in other families. However, with the demand for faster and quieter integrated circuits increasing, there is a need for CMOS logic circuits which operate at even higher speeds with even less power supply fluctuation than those currently available.

OBJECTS OF THE INVENTION

Therefore, it is an object of this invention to overcome the aforementioned problems.

It is another object of this invention to provide a CML circuit that can be driven at speeds of at least 500 MHz even using 0.7 μm technology.

It is a further object of this invention to provide a CML circuit having an active MOS load that operates exclusively in the triode region.

It is yet another object of this invention to provide a high speed CML circuit having an active MOS load operating exclusively in the triode region that is compatible with a CMOS VCO having a similar load structure.

SUMMARY OF THE INVENTION

In one aspect of the invention, a logic circuit is provided that includes a bias circuit and a logic portion that may be a logic gate, such as an XOR gate, an XNOR gate, a NAND gate, a NOR gate, etc. and/or a flip-flop, such as a D flip-flop. The logic portion may also embody a more complex digital circuit comprised of a plurality of logic gates and/or flip-flops.

The bias circuit has a first pair of MOS transistors and a third MOS transistor, wherein the first pair of transistors are configured to cause the third MOS transistor to operate in the triode region. The bias circuit may further comprise a plurality of current mirror MOS transistors which cooperate to generate a reference current in the bias circuit.

The logic portion has a plurality of pairs of input MOS transistors, and a plurality of load MOS transistors, a respective one of which is coupled to each pair of input MOS transistors. In accordance with the invention, the bias circuit causes each of the load MOS transistors to operate in the triode region.

To cause the third transistor of the bias circuit and the load transistors of the logic portion to operate in the triode region, one of the first pair of transistors in the bias circuit has an aspect ratio ($W_P/L_P$) and the other has an aspect ratio ($W_P/L_P$)/n, wherein $1<n<4$. In addition, a bias voltage is generated at the gate of the third transistor of the bias circuit and this voltage is applied to the gate of each of the load transistors of the logic portion.

The logic portion is preferably a differential input/output circuit. Thus, the plurality of input MOS transistors includes first and second pairs of input transistors for receiving a first differential input signal. The logic portion also includes a third pair of input MOS transistors for receiving a second differential input signal.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a circuit diagram of a high speed CML circuit, including an XOR/XNOR gate and a bias circuit, constructed in accordance with preferred embodiments of the invention.

FIG. 2 is a circuit diagram of a D flip-flop which may be embodied in a high speed CML circuit of this invention.

DESCRIPTION OF THE PREFERRED EMBODIMENTS

Referring to FIG. 1, a diagram of a high speed CML circuit is illustrated in accordance with preferred embodiments of the invention. The CML circuit 10 includes a bias circuit and a logic portion, identified generally by the reference numerals 11 and 12 respectively. In FIG. 1 the logic portion 12 is a combination exclusive-OR/exclusive-NOR gate (XOR/XNOR gate). The bias circuit 11 generates a stable and predictable dc current that is used to bias the XOR/XNOR gate 12. Both the bias circuit 11 and the XOR/XNOR gate 12 are comprised of a plurality of MOS transistors of both the NMOS and PMOS type. In the description and drawings herein NMOS transistors are designated with the prefix N and PMOS transistors with the prefix P.

A constant input bias current, designated as Ibias, in FIG. 1, is applied to the drain of transistor N1 in the bias circuit 11. Ibias may be any suitable current value such as, for example, 100 μA. The drain and gate of transistor N1 are coupled to the gate of each of transistors N2 and N3 to form a pair of current mirrors.

In accordance with the invention, the bias circuit 11 further includes a pair of transistors P4 and P5 which are configured such that the ratio of their aspect ratios is within a certain range so as to force transistor P6 to operate exclusively in the triode region. Specifically, if the aspect ratio of P4=($W_P L_P$), then the aspect ratio of P5=($W_P L_P$)/n, where 1<n<4. By adjusting n to adjust the relationship between the aspect ratios of P4 and P5, the voltage VPX at the drain of P6 can be adjusted. If n=2, then $|V_{GS5}-V_{TP}|=\sqrt{2}\cdot|V_{GS4}-V_{TP}|$ because the current through P5 is equal to the current through P4. $V_{GS4}$ and $V_{GS5}$ are the gate to source voltages of transistors P4 and P5 respectively and $|V_{TP}|$ is the magnitude of the threshold voltage which is approximately 0.7 V here.

The drain and gate of P4 are coupled to each other and to the gate of transistor P6 in current mirror configuration to form a node where a bias voltage PB is generated. Similarly, the drain and gate of P5 are also coupled together and also to the gate of transistor P8 to form a node, although P5 and P8 are not current mirror transistors because of the positioning of P6. The sources of transistors P4, P5 and P6 are coupled to a voltage supply source AVDD which may be, for example, 3.3 V or 5.0 V, while the source of transistor P8 is coupled to the drain of transistor P6 to form the node where voltage VPX is generated. The drains of transistors P4, P5 and P8 are connected to the drains of transistors N2, N3 and N10 respectively, and the sources of those latter three transistors as well as the source of transistor N1 are coupled to AVSS which may be grounded or may be a second voltage source.

In operation, the constant input current Ibias is used to generate a reference current Iref and bias voltages NB and PB. Iref flows through transistors P4 and N2 and also through transistors P5 and N3 as a result of the current mirrors formed by N1 and N2 and also by N1 and N3. In the second stage of the bias circuit 11, P8 is biased by the voltage PB2 generated at the drain of P5 and operates in the saturation region when the ratio of the aspect ratios of P4 and P5 is set within the range previously described. As a result of this design, P8's bias voltage PB2 is not high enough to keep the voltage VPX at the drain of P6 at a sufficiently low level to enable it to operate in the saturation region. Mathematically, $|V_{DS6}|=|V_{GS5}|-|V_{GS8}|<|V_{GS6}|-|V_{TP}|$, where $|V_{TP}|\approx 0.7V$. This forces P6 to operate exclusively in the triode region. With P6 operating in the triode region, its current $I_D'$ is always less than Iref. Moreover, operating in the triode region, P6 acts like a resistor with excellent linearity characteristics.

Turning now to the logic portion of CML circuit 10, XOR/XNOR gate 12 is a differential input/output gate having two pairs of differential input nodes and a pair of differential output nodes. A first differential input signal, defined as the difference between signals INAN and INAP, is applied to the first pair of differential input nodes and a second differential signal, defined as the difference between signals INBN and INBP, is applied to the second pair of differential input nodes. A differential output signal is defined as the difference between signals ON and OP.

The inputs INAN, INAP, INBN, and INBP of gate 12 are received from a driving circuit such as a voltage controlled oscillator or differential receiver (not shown). Although any compatible driving circuit may be used, the preferred driving circuit is a CMOS voltage controlled oscillator which has a load structure similar to that of the CML circuit 10 (i.e., a VCO which employs active MOS loads operating exclusively in the triode region). A VCO having such a load structure and a voltage-current converter is the subject of a separate patent application entitled: "CMOS Voltage Controlled Oscillator," filed on even date herewith in the names of Jason Chen and Ping Xu and assigned to the assignee of this application, the disclosure of which is incorporated by reference herein. By using this CMOS VCO, the CML circuits of this invention can be driven at speeds of at least 500 MHz using 0.7 μm technology which is about twice as fast as conventional CMOS logic circuits using 0.7 μm technology.

XOR/XNOR gate 12 includes a plurality of input transistors, including a first pair of transistors identified as N11 and N12 and a second pair of transistors identified as N13 and N14. Preferably, N11–N14 are all of the same size, meaning that they each have same channel width and channel length. The gates of N11 and N13 receive input voltage signal INAN while the gates of N12 and N14 receive input signal INAP. The sources of input transistors N11 and N14 are connected together and to the drain of input transistor N15 to form a node with voltage COM2. Similarly, the sources of input transistors N12 and N13 are connected together and to the drain of input transistor N16 to form a node with voltage COM3. N15 and N16 constitute a third pair of input transistors, the gates of which receive input voltage signals INBN and INAP respectively. N15 and N16, which are preferably of the same size, have their sources coupled together and to the drain of current source transistor N17 to form a node having voltage COM1. N17, which is preferably the same size as N10, has its source terminal coupled to VSS1 which may be ground or a voltage source. Bias voltage NB is applied to the gate of transistor N17.

The drains of transistors N11 and N12 are coupled together and to the drain of a PMOS load transistor P18 to form a node off of which output voltage signal ON is taken. A second PMOS load transistor P19 is coupled to input transistors N13 and N14 in a similar fashion. Preferably, load transistors P18 and P19, along with transistors P6 and P8, are all of the same size. Output signal OP is produced at a node joining the drains of transistors N13, N14 and P19. The sources of load transistors P18 and P19 are coupled to each other and to voltage supply source VDD1 which is the same as AVDD in bias circuit 11. The gates of transistors P18 and P19 are each biased by voltage PB.

The differential input signals each have a small swing range of about 0.5 V. The swing range generally extends from about (AVDD−0.5 V) to about AVDD. The differential output signal has about the same swing range. Thus, each transistor in the logic gate must be appropriately sized so that the circuit can completely turn on and off.

In accordance with the invention, PMOS load transistors P18 and P19 are forced to operate exclusively in the triode region in the same way that transistor P6 is forced into the triode region: that is, by maintaining the ratio of the aspect ratios of transistors P4 and P5 within the prescribed range. Doing so forces P6 to operate in the triode region which, in turn, causes each of the load transistors P18 and P19 in XOR/XNOR gate 12 to operate in the triode region, since the gates of each of these transistors is biased by the voltage signal PB generated at the gate of P6. With this design, the bias current of current source transistor N17 remains, at all times during operation, less than the saturation currents of transistors P4 and P5. Thus, the bias circuit 11 guarantees that the PMOS load transistors P18 and P19 will remain in the triode region to provide the XOR/XNOR gate 12 with a good linear active load.

With its load transistors P18 and P19 operating exclusively in the linear triode region, XOR/XNOR gate 12 can be driven at speeds of at least 500 MHz using 0.7 μm technology which is about twice as fast as conventional CMOS logic circuits using 0.7 μm technology. In FIG. 1, AVDD=VDD1=$V_{DD}$ and AVSS=VSS1=$V_{SS}$. For the input/output signals, high (H)=$V_{DD}$ and low (L)=$V_{DD}$-ΔV (ΔV= 0.5 V here). Thus, it can be seen that when INAN=H (INAP=L) and INBN=H (INBP=L), INAP=L, then ON=L (OP=H). In this case, the output of the XOR portion of gate 12 is ON and the output of the XNOR portion is OP.

As previously noted, XOR/XNOR gate 12 represents just one type of logic circuit that may be embodied in CML circuit 10. Another type of logic circuit which may be constructed in accordance with the invention is a D flip-flop. Such a D flip-flop is illustrated in FIG. 2. The D flip—flip, identified by the reference numeral 112, may use the same bias circuit 11 shown and described in connection with XOR/XNOR gate 12 and, for that reason, a bias circuit is not shown in FIG. 2.

The D flip-flop 112 shown in FIG. 2 is composed of two stages, a master stage 113 and a slave stage 114. The D flip-flop 112 has two types of input signals: a differential data input signal, generated from the difference between input data signals DN and DP, and a differential clock input signal, generated from the difference between input clock signals CLKN and CLKP. As is the case with XOR/XNOR gate 12, the inputs of D flip-flop 112 are received from a driving circuit such as a voltage controlled oscillator or differential receiver (not shown). Again, although any compatible driving circuit may be used, to achieve high speeds of at least 500 MHz using 0.7 μm technology, the preferred driving circuit is set forth in the patent application entitled: "CMOS Voltage Controlled Oscillator," filed on even date herewith in the names of Jason Chen and Ping Xu.

The master stage 113 of D flip-flop 112 includes a plurality of input transistors, including a first pair of transistors, N111 and N112, and a second pair of transistors, N113 and N114. The gates of N111 and N114 are biased by data input signals DP and DN respectively to form the differential data input signal, and the sources of these two transistors are coupled together to form a node with a voltage COM2. The drains of N111 and N112 are coupled together to form a node from which a voltage signal ON1 is taken and applied to the gate of N113. Similarly, the drains of N113 and N114 are connected together to form a node from which a voltage signal OP1 is taken and applied to the gate of N112. The sources of N112 and N113 are connected together forming a node with voltage COM3. N115 and N116 constitute a third pair of input transistors coupled at their sources and to the drain of current source transistor N117 to form a node with voltage COM1. The gates of transistors N115 and N116 receive clock input signals CLKN and CLKP respectively. The source of transistor N117 is coupled to VSS1 which may be ground or a voltage source. Bias voltage NB is applied to the gate of N117.

Two PMOS load transistors, P118 and P119, are provided. The drain of P118 is coupled to the common drain connection between transistors N111 and N112 and the drain of P119 is coupled to the common drain connection between N113 and N114. The sources of transistors P118 and P119 are interconnected and also connected to voltage supply source VDD1 which may be, for example, 3.3 or 5.0 V. The gates of transistors P118 and P119 are each biased by voltage PB.

The slave stage 114 of D flip-flop 112 also includes a plurality of input transistors, including a first pair, N121 and N122, and a second pair, N123 and N124. The gates of N121 and N124 are biased by differential input signals ON1 and OP1 respectively, and the sources of these two transistors are coupled together to form a node with a voltage COMB2. The drains of N121 and N122 are coupled together to form a node from which an output voltage signal OP is taken; OP is also applied to the gate of N123. Similarly, the drains of N123 and N124 are connected together to form a node from which an output voltage signal ON is taken; ON is also applied to the gate of N122. The sources of N122 and N123 are connected together forming a node with voltage COMB3. N125 and N126 constitute a third pair of input transistors coupled at their sources and to the drain of current source transistor N127 to form a node with voltage COM11. The gates of transistors N125 and N126 receive clock input signals CLKP and CLKN respectively. The source of transistor N127 is coupled to VSS1 which may be ground or a voltage source. Bias voltage NB is applied to the gate of N127.

Two PMOS load transistors, P128 and P129, are provided. The drain of P128 is coupled to the common drain connection between transistors N121 and N122 and the drain of P129 is coupled to the common drain connection between N123 and N124. The sources of transistors P128 and P129 are interconnected and are also connected to VDD1. The gates of transistors N128 and N129 are each biased by voltage PB.

Preferably, input transistors N111–N114 and N121–N124 are all of the same size; input transistors N115, N116, N125 and N126 are all of the same size; transistors N10, N117 and N127 are all of the same size; and transistors P6, P8, P118, P119, P128 and P129 are all of the same size.

In accordance with the invention, PMOS load transistors P118, P119, P128, and P129 are forced to operate exclusively in the triode region, as previously described with reference to load transistors P18 and P19 of XOR/XNOR gate 12. With this design, the bias currents of current source transistors N117 and N127 remain, at all times during operation, less than the saturation currents of transistors P4 and P5 in bias circuit 11. Thus, the bias circuit 11 guarantees that the PMOS load transistors P118, P119, P128 and P129 will remain in the triode region to provide the D flip-flop 112 with a good linear active load.

With its load transistors P118, P119, P128 and P129 operating exclusively in the linear triode region, D flip-flop 112 can be driven at speeds of at least 500 MHz using 0.7 μm technology which is about twice as fast as conventional CMOS logic circuits using 0.7 μm technology.

In addition to the XOR/XNOR gate 12 and D fflip-flop 112 described herein, other types of logic circuits may also be constructed in accordance with the invention. The CML circuit 10 of the present invention may embody other logic gates including, for example, inverter, NAND, AND, NOR and OR gates. In fact, complementary gates such as NAND/AND gates and NOR/OR gates may employ the same circuit with one of the complementary gates using one output and the other using the other output. CML circuit 10 may also embody other types of flip-flops for use as memory devices in clocked sequential circuits. Examples of such flip-flops include RS, JK and T flip-flops. In addition, each of these gates and flip-flops may use the same bias circuit as that described herein. Also, as is well known in the art, a plurality of logic gates and/or flip-flops may be interconnected to form more complex digital circuits. In this case, a single bias circuit of the type described herein may be used to bias all of the individual gates and/or flip-flops. The construction and implementation of such CML circuits embodying one or more of these gates and/or flip-flops is well within the reach of those skilled in the art in light of the techniques and operating principles described herein.

While the invention has been described in conjunction with specific embodiments, it will be evident to those skilled in the art in light of the foregoing description that many further alternatives, modifications and variations are possible. Thus, the invention described herein is intended to embrace all such alternatives, modifications, applications and variations as may fall within the spirit and scope of the appended claims.

What is claimed is:

1. A logic circuit, comprising:

a bias circuit having a first pair of MOS transistors and a third MOS transistor, wherein one of said first pair of transistors has an aspect ratio greater than an aspect ratio of the other of the first pair of transistors causes said third MOS transistor to operate in a triode region; and a logic portion having a plurality of pairs of input MOS transistors, and a plurality of load MOS transistors, a respective one of which is coupled to each pair of input MOS transistors, wherein said bias circuit causes each of the load MOS transistors to operate in the triode region.

2. The logic circuit of claim 1, wherein said first pair of MOS transistors are configured such that one of said first pair of MOS transistors has an aspect ratio ($W_P/L_P$) and the other of said first pair of MOS transistors has an aspect ratio ($W_P/L_P$)/n, wherein $1<n<4$.

3. The logic circuit of claim 1, wherein said bias circuit further comprises a plurality of current mirror MOS transistors which cooperate to generate a reference current.

4. The logic circuit of claim 1, wherein said plurality of input MOS transistors includes first and second pairs of input MOS transistors for receiving a first differential input signal.

5. The logic circuit of claim 4, wherein said plurality input MOS transistors further includes a third pair of input MOS transistors for receiving a second differential input signal.

6. The logic circuit of claim 5, wherein said bias circuit generates a bias voltage that is applied to a gate of each of said load MOS transistors.

7. The logic circuit of claim 6, wherein the bias voltage is generated at a gate of said third MOS transistor of said bias circuit.

8. The logic circuit of claim 1, wherein said logic portion comprises a logic gate.

9. The logic circuit of claim 8, wherein said logic gate is selected from the group consisting of AND, OR, inverter, NAND, NOR, XOR and XNOR.

10. The logic circuit of claim 1, wherein said logic portion comprises a flip-flop.

11. The logic circuit of claim 10, wherein said flip-flop is selected from the group consisting of RS flip-flop, D-flip-flop, JK flip-flop and T flip-flop.

* * * * *